United States Patent
Tsuchida

(10) Patent No.: US 12,509,355 B2
(45) Date of Patent: Dec. 30, 2025

(54) YAG SINTERED BODY, METHOD FOR PRODUCING THE SAME, SEMICONDUCTOR MANUFACTURING EQUIPMENT MEMBER, AND GAS NOZZLE

(71) Applicant: Niterra CO., LTD., Nagoya (JP)

(72) Inventor: Atsushi Tsuchida, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 382 days.

(21) Appl. No.: 18/317,448

(22) Filed: May 15, 2023

(65) Prior Publication Data

US 2023/0373807 A1    Nov. 23, 2023

(30) Foreign Application Priority Data

May 17, 2022    (JP) ................. 2022-081127

(51) Int. Cl.
  *C01F 17/34*    (2020.01)
  *H01L 21/67*    (2006.01)

(52) U.S. Cl.
  CPC ........ *C01F 17/34* (2020.01); *H01L 21/67017* (2013.01); *C01P 2004/03* (2013.01); *C01P 2006/90* (2013.01)

(58) Field of Classification Search
  None
  See application file for complete search history.

(56) References Cited

U.S. PATENT DOCUMENTS

| | | |
|---|---|---|
| 6,383,964 B1 | 5/2002 | Nakahara et al. |
| 9,790,596 B1 | 10/2017 | Kajiwara |
| 2003/0034130 A1* | 2/2003 | Fujita ............... H01J 37/32559 118/723 R |
| 2003/0049499 A1 | 3/2003 | Murakawa et al. |
| 2011/0111205 A1* | 5/2011 | Park ...................... C04B 35/591 428/313.9 |
| 2011/0189622 A1* | 8/2011 | Yamashita .......... C04B 35/6455 433/199.1 |
| 2012/0058883 A1* | 3/2012 | Yamashita ............. B82Y 30/00 501/134 |
| 2013/0217562 A1* | 8/2013 | Yamauchi ............... C04B 35/49 501/86 |

(Continued)

FOREIGN PATENT DOCUMENTS

| | | |
|---|---|---|
| JP | H08-081258 A | 3/1996 |
| JP | H10-236871 A | 9/1998 |

(Continued)

OTHER PUBLICATIONS

Japan Patent Office, Office Action (Notice of Reasons for Refusal) issued in corresponding Application No. JP 2022-081127, issued Jul. 29, 2025.

*Primary Examiner* — Bilkis Jahan
(74) *Attorney, Agent, or Firm* — Stites & Harbison, PLLC; Jeffrey A. Haeberlin

(57) ABSTRACT

A YAG sintered body has a predetermined surface where intragranular pores are exposed. On the predetermined surface, arithmetic average roughness Ra satisfies Ra≤0.5 μm, and a ratio between maximum height Rz and maximum valley depth Rv satisfies Rv/Rz≤0.7. With this configuration, the predetermined surface of a processed surface is smoothed to have improved plasma resistance and exhibit a particle-suppressing effect.

12 Claims, 4 Drawing Sheets

(56) References Cited

U.S. PATENT DOCUMENTS

2017/0140970 A1† 5/2017 Boyd
2021/0163310 A1† 6/2021 Makoto
2021/0276880 A1* 9/2021 Zhang .................... C01G 23/08

FOREIGN PATENT DOCUMENTS

JP  2000-191369 A   7/2000
JP      6046752 B2  12/2016

\* cited by examiner
† cited by third party

FIG. 4

| | HEAT TREATMENT CONDITIONS | Ra (μm) | | Rv/Rz | | INTRAGRANULAR PORE COUNT (NUMBER) | AREA PERCENTAGE (%) OF SEGREGATED $Al_2O_3$ |
|---|---|---|---|---|---|---|---|
| | | BEFORE HEAT TREATMENT | AFTER HEAT TREATMENT | BEFORE HEAT TREATMENT | AFTER HEAT TREATMENT | | |
| EXAMPLE 1 | 1400°C×1h | 0.32 | 0.33 | 0.83 | 0.68 | 8 | 0.3 |
| EXAMPLE 2 | 1500°C×1h | 0.38 | 0.37 | 0.82 | 0.68 | 16 | 0.3 |
| EXAMPLE 3 | 1600°C×1h | 0.29 | 0.31 | 0.74 | 0.59 | 28 | 0.4 |
| EXAMPLE 4 | 1700°C×1h | 0.32 | 0.34 | 0.76 | 0.58 | 28 | 0.4 |
| COMPARATIVE EXAMPLE 1 | NO ANNEALING AFTER MACHINING | 0.36 | — | 0.86 | — | UNMEASURABLE | 0.2 |
| COMPARATIVE EXAMPLE 2 | NO MACHINING AS-SINTERED | 0.28 | — | 0.59 | — | 0 | 0.3 |
| COMPARATIVE EXAMPLE 3 | 1300°C×1h | 0.32 | 0.35 | 0.81 | 0.80 | UNMEASURABLE | 0.3 |
| COMPARATIVE EXAMPLE 4 | 1800°C×1h | 0.33 | 0.55 | 0.79 | 0.73 | 11 | 0.5 |

FIG. 5

| | HEAT TREATMENT CONDITIONS | Ra (μm) | | Rv/Rz | | INTRAGRANULAR PORE COUNT (NUMBER) |
|---|---|---|---|---|---|---|
| | | BEFORE HEAT TREATMENT | AFTER HEAT TREATMENT | BEFORE HEAT TREATMENT | AFTER HEAT TREATMENT | |
| EXAMPLE 3 | 1600°C×1h | 0.29 | 0.31 | 0.74 | 0.59 | 28 |
| EXAMPLE 3-2 | | 0.30 | 0.34 | 0.77 | 0.61 | 63 |

FIG. 6

| | HEAT TREATMENT CONDITIONS | Ra (μm) | | Rv/Rz | | AREA PERCENTAGE (%) OF SEGREGATED Al₂O₃ |
|---|---|---|---|---|---|---|
| | | BEFORE HEAT TREATMENT | AFTER HEAT TREATMENT | BEFORE HEAT TREATMENT | AFTER HEAT TREATMENT | |
| EXAMPLE 3 | 1600°C×1h | 0.29 | 0.31 | 0.74 | 0.59 | 0.4 |
| EXAMPLE 3-3 | | 0.31 | 0.34 | 0.76 | 0.62 | 2.3 |

YAG SINTERED BODY, METHOD FOR PRODUCING THE SAME, SEMICONDUCTOR MANUFACTURING EQUIPMENT MEMBER, AND GAS NOZZLE

BACKGROUND OF THE INVENTION

1. Field of the Invention

The present invention relates to a YAG sintered body, a method for producing the YAG sintered body, a semiconductor manufacturing equipment member including the YAG sintered body, and a gas nozzle.

2. Description of the Related Art

Traditionally, in semiconductor manufacturing equipment, when a thin film is formed on a surface of a substrate by chemical vapor deposition (CVD) or the thin film is micromachined by etching, plasma gas is introduced into a reaction vessel containing the substrate. Therefore, the reaction vessel and members such as a gas nozzle for introducing plasma gas into the reaction vessel are required to have good resistance (plasma resistance) to plasma-converted halogen gases such as fluoride gas.

PTL 1 discloses an alumina ceramic sintered body obtained by sintering an alumina ceramic compact formed into a desired shape, optionally grinding the sintered body, and then heat treating the sintered body at 1000° C. to 1550° C. for 0.1 to 6 hours.

PTL 2 discloses a plasma-resistant member having a surface, which is to be exposed to plasma in an atmosphere of a corrosive gas such as fluorine or chlorine gas, that is formed of an yttrium-aluminum-garnet (YAG: $Y_3Al_5O_{12}$) sintered body having a porosity of 3% or less and has a center-line average roughness (Ra) of 1 μm or less.

PTL 3 discloses a gas nozzle including a columnar main body formed of a ceramic sintered body in which through holes through which gas flows are formed. The main body, at its one end face, is provided with a gas outlet port of the through hole. The inner wall of the through hole has a first region located near the outlet port and a second region located inside the main body with respect to the first region. The first region and the second region are formed of as-sintered surfaces of the ceramic sintered body. The average grain size in the first region is larger than the average grain size in the second region.

CITATION LIST

Patent Literature

PTL 1: Japanese Unexamined Patent Application Publication No. 08-081258
PTL 2: Japanese Unexamined Patent Application Publication No. 10-236871
PTL 3: Japanese Patent No. 6046752

SUMMARY OF THE INVENTION

However, the alumina sintered body disclosed in PTL 1 may have insufficient plasma resistance when used as a semiconductor manufacturing equipment member. The YAG sintered body in PTL 2 may be subjected to surface machining such as grinding or polishing in order to have a desired shape or surface roughness, but machining damage increases the risk of particle detachment from the machined surface due to plasma. In addition, $Al_2O_3$ may segregate at grain boundaries of the sintered body depending on the production conditions, which results in a difference in plasma resistance at the grain boundaries because $Al_2O_3$ has lower plasma resistance than YAG.

When the surface is left as-sintered as in the gas nozzle disclosed in PTL 3, machining after sintering cannot be performed. Thus, in the case of having a complicated flow channel or the case of a small-sized member with a narrow flow channel, it is difficult to control shrinkage during firing, which may result in a less accurate flow channel.

The present invention has been made in view of these circumstances, and an object thereof is to provide a YAG sintered body having a surface that, if processed (e.g., machined), has high plasma resistance to exhibit a particle-suppressing effect and usable as a semiconductor manufacturing equipment member.

In accordance with one aspect of the invention, a YAG sintered body includes a predetermined surface where intragranular pores are exposed, wherein, on the predetermined surface, arithmetic average roughness Ra satisfies Ra≤0.5 μm, and a ratio between maximum height Rz and maximum valley depth Rv satisfies Rv/Rz≤0.7.

With this configuration in which, on the predetermined surface where intragranular pores are exposed, arithmetic average roughness Ra satisfies Ra≤0.5 μm, and a ratio between maximum height Rz and maximum valley depth Rv satisfies Rv/Rz≤0.7, a processed surface (e.g., a machined surface) of the predetermined surface is smoothed to have improved plasma resistance and exhibit a particle-suppressing effect.

In one implementation, on the predetermined surface, a number of the intragranular pores observed in an area of 80 μm×60 μm is 40 or less.

With this configuration in which, on the predetermined surface, the number of intragranular pores observed in an area of 80 μm×60 μm is 40 or less, the plasma resistance of the predetermined surface can be further improved.

In another implementation, on the predetermined surface, the area percentage of aluminum oxide observed in an area of 80 μm×60 μm is 2.0% or less.

With this configuration in which, on the predetermined surface, the area percentage of aluminum oxide observed in an area of 80 μm×60 μm is 2.0% or less, the plasma resistance of the predetermined surface can be further improved.

In yet another implementation, on the predetermined surface, the area percentage of aluminum oxide observed in the area of 80 μm×60 μm is 2.0% or less.

With this configuration in which, on the predetermined surface, the area percentage of aluminum oxide observed in the area of 80 μm×60 μm is 2.0% or less, the plasma resistance of the predetermined surface can be further improved.

In accordance with another aspect of the invention, a semiconductor manufacturing equipment member includes any implementation of the YAG sintered body described above.

This semiconductor manufacturing equipment member including the YAG sintered body of the present invention, even after the YAG sintered body is processed, can have a processed surface with improved plasma resistance and is suitable for use as a semiconductor manufacturing equipment member required to have plasma resistance.

In accordance with yet another aspect of the invention, a gas nozzle for use in semiconductor manufacturing equipment includes the semiconductor manufacturing equipment member described above.

This semiconductor manufacturing equipment member including YAG sintered body of the present invention can be used as, for example, a gas nozzle for introducing a corrosive gas into a reaction vessel. The YAG sintered body of the present invention ensures that even a processed surface after sintering has improved plasma resistance, and thus the semiconductor manufacturing equipment member is readily applicable even to, for example, a complicated gas nozzle with a narrow gas flow channel.

In accordance with still yet another aspect of the invention, a method for producing a YAG sintered body includes a step of preparing a YAG sintered body, a step of processing (e.g., machining) a predetermined surface of the YAG sintered body to arithmetic average roughness Ra of 0.5 μm or less, and a step of heat treating the processed YAG sintered body at a temperature of 1400° C. or higher and 1700° C. or lower for 1 hour or more.

By processing a predetermined surface to Ra of 0.5 μm or less and performing heat treatment at a temperature of 1400° C. or higher and 1700° C. or lower for 1 hour or more as described above, the plasma resistance of the predetermined surface can be improved, and the YAG sintered body, the semiconductor manufacturing equipment member including the YAG sintered body, and the gas nozzle, all as described above, and the like can be produced. Furthermore, processing can be performed after sintering to provide a processed surface with improved plasma resistance. Thus, there is no need to strictly control the shrinkage rate of a compact in firing, and a precise structure can be produced even in the case of having a complicated flow channel or the case of a small-sized structure with a narrow flow channel.

According to the YAG sintered body of the present invention, the plasma resistance of a processed surface of the predetermined surface of the YAG sintered body can be ensured, and the risk of dust particle generation can be reduced.

BRIEF DESCRIPTION OF THE DRAWINGS

FIG. 4 is a table showing the test results of Examples and Comparative Examples;

FIG. 5 is a table showing the test results of Example 3 and Example 3-2; and

FIG. 6 is a table showing the test results of Example 3 and Example 3-3.

DETAILED DESCRIPTION OF EXEMPLARY EMBODIMENTS OF THE INVENTION

Figure 1:
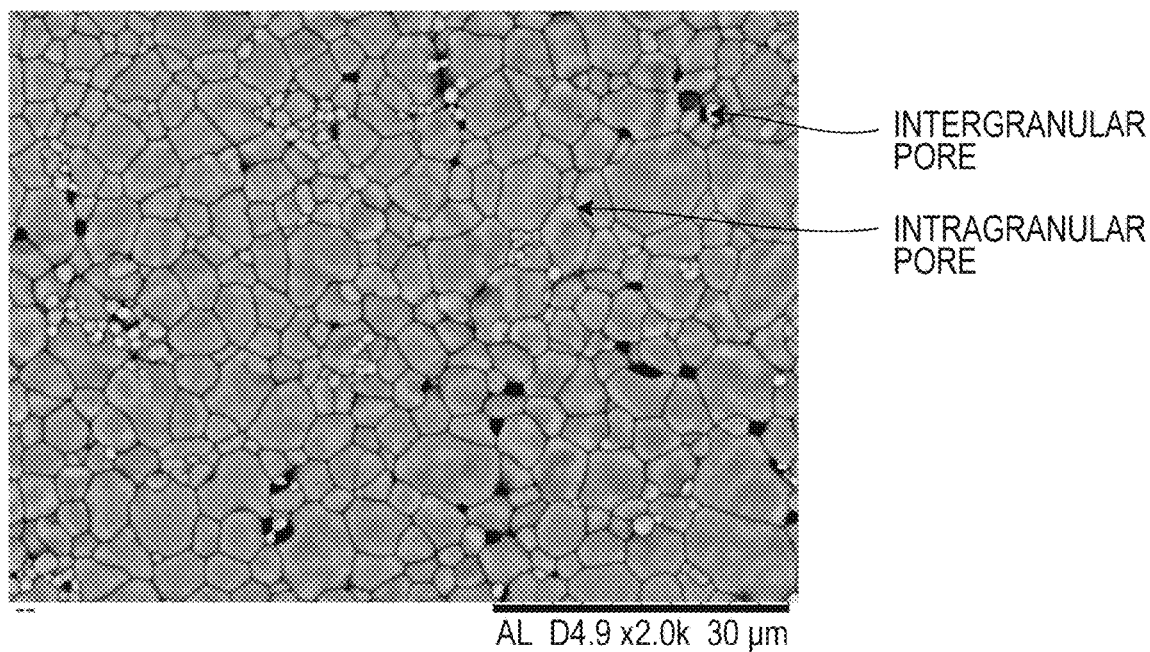
FIG. 1 shows the positions of an intergranular pore and an intragranular pore in an SEM image of a surface of a YAG sintered body.

Next, an embodiment of the present invention will be described. It should be noted that in configuration diagrams, the sizes of components are conceptual and are not necessarily drawn to scale.

Configuration of YAG Sintered Body

Embodiment

A YAG sintered body of the present invention has a predetermined surface where intragranular pores are exposed. On the predetermined surface, arithmetic average roughness Ra satisfies Ra≤0.5 μm, and a ratio between maximum height Rz and maximum valley depth Rv satisfies Rv/Rz≤0.7. The predetermined surface where intragranular pores are exposed is a processed surface that has been subjected to grinding, polishing, or other machining after the YAG sintered body is fired, and is an area expected to be directly exposed to a corrosive gas. The predetermined surface where intragranular pores are exposed is, for example, a gas outlet of a gas nozzle.

Pores of a sintered body are formed depending on the state of raw material powders, mixing conditions, firing conditions, etc. in the production process. Among the pores, intergranular pores are present on as-sintered surfaces, while intragranular pores are absent on as-sintered surfaces. Pores remaining in grains (intragranular pores) will be exposed on the surface by processing a sintered body after firing into a desired shape or performing processing to form a through hole. Such a processed surface where intragranular pores are exposed may have low plasma resistance.

After a YAG sintered body is fired, the surface state of a processed surface subjected to surface processing is such that processing damage such as microcracking or particle chipping has occurred. Thus, even processing to a surface roughness (Ra) comparable to those of as-sintered surfaces sometimes resulted in failure to improve plasma resistance. Although there are many possible causes for this, the present inventors have presumed that in addition to the exposure of intragranular pores, one of the causes is an increase in maximum valley depth (Rv) due to surface processing.

While the maximum peak height (Rp) can be controlled to some extent by surface processing, the maximum valley depth (Rv) is difficult to control by processing such as polishing. If there is a part with a great depth in a surface of a sintered body, for example, chips and the like generated during processing may enter the part. If the chips that have entered the groove are not completely removed at the time of cleaning of a member, the chips may fall off as particles during actual use. When the maximum valley depth (Rv) is large, the valleys become deeper when subjected to plasma erosion, thus increasing the possibility of dust particle generation.

The present inventors have found that by performing heat treatment at a predetermined temperature after processing of a YAG sintered body, Rv/Rz can be reduced without greatly changing Ra, and the plasma resistance of the processed surface can be improved, thereby completing the present invention.

The YAG sintered body of the present invention has a predetermined surface where intragranular pores are exposed. On the predetermined surface, not only arithmetic average roughness (Ra) satisfies Ra≤0.5 μm, but also a ratio of maximum height (Rz) (μm) to maximum valley depth (Rv) (μm) satisfies Rv/Rz≤0.7. With this surface state, the surface is smoothed to have improved plasma resistance and exhibit a particle-suppressing effect. In addition, the shallow maximum valley depth (Rv) with respect to the maximum height (Rz) provides a member with improved cleanability. The roughness can be determined using a stylus-type surface roughness meter (in accordance with JIS B 0601). Surfaces of the YAG sintered body of the present invention other than the predetermined surface may, but need not, satisfy Ra≤0.5 μm and Rv/Rz≤0.7. The surfaces other than the predetermined surface may be processed surfaces or as-sintered surfaces.

The YAG sintered body of the present invention contains yttrium-aluminum-garnet (hereinafter referred to as YAG) as a main component. Containing YAG as a main component means that YAG ($Y_3Al_5O_{12}$) is contained in an amount of 93.0 wt % or more in the sintered body. As components other than YAG, for example, composite oxides of Y and Al or oxides of Y or oxides of Al, such as YAM, YAP, $Y_2O_3$, or $Al_2O_3$, may be contained. To impart a specific function to the YAG sintered body, a specific metal element or metal oxide may be added.

The intragranular pores exposed on the predetermined surface are more susceptible to plasma erosion than other parts and can cause dust particle generation. Thus, the number thereof is preferably small. In the YAG sintered body of the present invention, on the predetermined surface, the number of intragranular pores observed in an area of 80 μm×60 μm is preferably 40 or less. This can further improve the plasma resistance of the predetermined surface. The number of intragranular pores can be minimized by using raw material powders with a uniform average particle size or performing firing at a slow temperature increasing rate. However, such strict control in the production process cannot eliminate the intragranular pores. Thus, the number of intragranular pores observed in an area of 80 μm×60 μm is usually at least three.

On the predetermined surface, the number of intragranular pores observed in an area of 80 μm×60 μm is determined by capturing an image of the predetermined surface with a scanning electron microscope (SEM), randomly selecting three fields of view of 80 μm×60 μm, and averaging the numbers of intragranular pores observed in the fields of view. FIG. 1 shows the positions of an intergranular pore and an intragranular pore in an SEM image of a surface of the YAG sintered body. As can be seen, the intergranular pore and the intragranular pore are easily recognized as different pores in the SEM image.

Simple aluminum oxide ($Al_2O_3$) may locally segregate at grain boundaries of the YAG sintered body to cause an uneven structure. Parts existing as simple aluminum oxide have lower plasma resistance than other parts existing as YAG, and thus are susceptible to plasma erosion and can cause dust particle generation. Thus, such segregated parts are preferably as small as possible.

In the YAG sintered body of the present invention, the area percentage of aluminum oxide observed in an area of 80 μm×60 μm on the predetermined surface is preferably 2.0% or less. This can further improve the plasma resistance of the predetermined surface. In addition, since the state of at least the predetermined surface exposed to a corrosive gas satisfies the arithmetic average roughness Ra of 0.5 μm or less and the ratio between maximum height (Rz) and maximum valley depth (Rv), Rv/Rz, of 0.7 or less, segregated parts are in good contact with adjacent YAG grains, and thus particle detachment due to plasma erosion of the segregated parts is less likely to occur. The segregation of aluminum oxide can be reduced by increasing the time of mixing the raw material powders.

The area percentage of aluminum oxide on the predetermined surface can be determined in the following manner. First, an image of the predetermined surface of the YAG sintered body is captured with a scanning electron microscope (SEM) at a magnification of 2000×. Next, a region with a predetermined color tone in the SEM image is confirmed to be segregated aluminum oxide. For the confirmation, the predetermined surface is subjected to EDS analysis to determine peaks of Y, Al, and O in the region. If the peak of Y is not observed and the peaks of Al and O are observed in the region, the region can be identified as segregated aluminum oxide. The captured image is then subjected to image processing such as binarization using image analysis software WinROOF (manufactured by MITANI Corporation) to determine the area percentage of the region with a predetermined color tone. The phrase "on the predetermined surface, the area percentage of aluminum oxide observed in an area of 80 μm×60 μm is 2.0% or less" means that the area percentages determined in three fields of view randomly selected as measurement points are each 2.0% or less.

In the YAG sintered body, the content of metal elements excluding yttrium and aluminum is preferably 1000 ppm or less. When the total content of metal elements excluding yttrium and aluminum is 1000 ppm or less, the plasma resistance can be sufficiently ensured. Examples of metal elements excluding yttrium and aluminum include Si, Ca, Na, Mg, Ti, Cr, Fe, Ni, Cu, and P. The metal elements in the present invention also include metalloid elements such as Si and P. When a specific metal element or metal oxide is added in order to impart a specific function to the YAG sintered body, the content of the metal element is excluded from the above-described content. The material for imparting a specific function to the YAG sintered body can be added in an amount of 0.1 wt % or more.

These trace metals tend to condense mainly in a grain boundary layer of the YAG sintered body and are more likely to corrode in a plasma environment than YAG. When the trace metal components corrode first, the corrosion of grain boundary portions causes particle detachment, deteriorating the plasma resistance. For this reason, the content of metal elements excluding yttrium and aluminum is preferably as low as possible. Thus, the content of metals excluding yttrium and aluminum is preferably 500 ppm or less, more preferably 300 ppm or less. The lower limit of the content of metal elements excluding yttrium and aluminum is preferably as low as possible. However, unavoidable impurities can be contained in the raw material powders or can get mixed during the production process, and thus the lower limit may be, for example, 1 ppm or more. To control the content of the trace metals to be in the above range, it is necessary to perform management so as to avoid contamination with impurities in the raw material powders or during the production process.

The content of yttrium and aluminum in the YAG sintered body in terms of oxides and the content of metal elements excluding yttrium and aluminum contained in the YAG sintered body can be determined by glow discharge mass spectrometry (GD-MS).

The YAG sintered body preferably has a relative density of 98% or more. Having such a sufficiently high relative density, the sintered body has high plasma resistance, high strength, and is suitable for use also as a large-sized member.

The relative density of the YAG sintered body can be expressed as (sintered body density/theoretical density)×100 (%). The theoretical density means a density (4.55 g/cm$^3$) of simple YAG, and the sintered body density is a density of the YAG sintered body measured by the Archimedes method.

The YAG sintered body of the present invention, whose surface has high plasma resistance even if processed after firing, is usable as a semiconductor manufacturing equipment member. In particular, since there is no need to strictly control the shrinkage rate of a compact in firing, and a precise structure can be produced even in the case of having a complicated flow channel or the case of a small-sized structure with a narrow flow channel, the YAG sintered body of the present invention is suitable as such a semiconductor manufacturing equipment member, for example, a gas nozzle.

Configuration of Semiconductor Manufacturing Equipment Member

Figure 2:
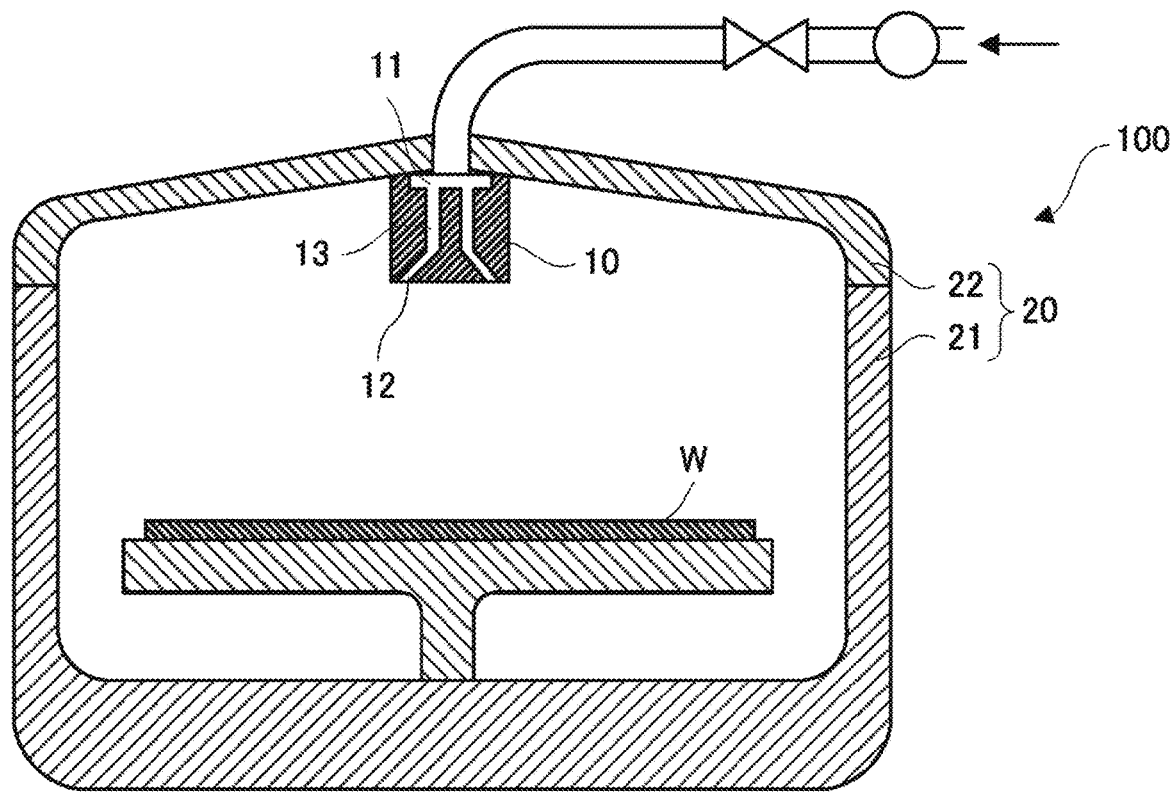
FIG. 2 is a schematic sectional view showing an example of how a semiconductor manufacturing equipment member according to an embodiment of the present invention is used.

Next, a semiconductor manufacturing equipment member of the present invention will be described. FIG. 2 is a schematic sectional view showing an example of how a semiconductor manufacturing equipment member according to an embodiment of the present invention is used. The semiconductor manufacturing equipment member of the present invention is suitable for use, for example, in a semiconductor manufacturing process or a liquid crystal manufacturing process as a container main body 21 or a lid 22 constituting a reaction vessel 20, particularly, as a gas nozzle 10, used in a film-forming device for forming a thin film on a substrate W, such as a semiconductor wafer or a glass substrate, or a plasma device 100 such as an etching device for micromachining the substrate W.

For example, in the case of a film-forming device, a thin film may be formed on the substrate W by a plasma chemical vapor deposition (CVD) method in which a source gas containing a corrosive gas is introduced into the reaction vessel 20 through the gas nozzle 10, and the source gas is converted into plasma. In the case of an etching device, the substrate W may be micromachined by introducing a halogen corrosive gas as a source gas into the reaction vessel 20 through the gas nozzle 10 and converting the corrosive gas into plasma to form an etching gas.

The gas nozzle 10 includes a gas supply port 11 through which a gas such as a corrosive gas is supplied from a gas supply unit (not shown), a gas outlet 12 through which the gas is discharged into the reaction vessel 20, and a nozzle hole 13 that provides communication between the gas supply port 11 and the gas outlet 12.

The semiconductor manufacturing equipment member according to an embodiment of the present invention is a member having a portion to be exposed to a corrosive gas or a corrosive chemical, here, a member constituting a portion of the gas nozzle 10 that is to be exposed to a corrosive gas, such as a portion including the nozzle hole 13 or at least a part of a portion exposed in the reaction vessel 20. The semiconductor manufacturing equipment member may constitute the entire gas nozzle 10. Alternatively, the semiconductor manufacturing equipment member may be, for example, the container main body 21 or the lid 22 constituting the reaction vessel 20, or may be a part thereof.

When the semiconductor manufacturing equipment member includes the YAG sintered body of the present invention, the plasma resistance of the semiconductor manufacturing equipment member can be ensured even if its surface is processed after firing, and the risk of dust particle generation can be reduced. In addition, even a complicated flow channel formed after firing or a small-sized structure with a narrow flow channel can be formed while the plasma resistance is ensured.

Method for Producing YAG Sintered Body

Next, a method for producing a YAG sintered body of the present invention will be described. The method for producing a YAG sintered body of the present invention includes a step of preparing a YAG sintered body that has yet to be heat treated, a step of processing the prepared YAG sintered body, and a step of heat treating the processed YAG sintered body. The step of preparing a YAG sintered body that has yet to be heat treated can be carried out by, for example, a conventional production method in which a compact is formed by casting or cold isostatic pressing (CIP) and fired to obtain a sintered body. An example of the step of preparing a YAG sintered body that has yet to be heat treated will be described below.

First, yttrium oxide powder and aluminum oxide powder are provided as raw material powders of a YAG sintered body. The purity of each powder is preferably 99.9% or more, more preferably 99.99% or more. The average particle size of each powder is preferably 0.1 µm or more and 10 µm or less.

Next, the yttrium oxide powder and the aluminum oxide powder are weighed at a predetermined composition ratio in terms of oxides in a YAG sintered body after sintering. The predetermined composition ratio is as follows: in a YAG sintered body after firing, Y is 37.5 mol % in terms of oxide ($Y_2O_3$), and Al is 62.5 mol % in terms of oxide ($Al_2O_3$). Errors of about 1.0 mol % are acceptable, but the composition ratio is preferably as close to the predetermined composition ratio as possible. The predetermined composition ratio is approximately 57:43 in terms of the weight ratio between the yttrium oxide powder and the aluminum oxide powder.

Next, the raw material powders are mixed. The powders are put into a pot together with, for example, a binder (e.g., PVA), and milled and mixed by wet mixing using a ball mill to prepare a raw slurry. In the preparation of the raw slurry, ion-exchange water or a dispersant may be used. In the ball mill, for example, resin balls can be used. The mixing time is preferably, for example, 15 hours or more and 45 hours or less.

Next, the slurry obtained in the mixing step is dried and granulated. One example of a method for obtaining granular powder from the slurry is a method in which the slurry is dried while being warmed in a vessel in hot water to remove the solvent from the slurry, thereby obtaining a powder, and the powder obtained is passed through a sieve. Alternatively, a spray dryer can also be used.

Next, the granular powder obtained in the granulation step is formed into a compact. The forming method may be, for example, a method in which the granular powder obtained is poured into a die and press formed. The press forming can be performed by a known method such as uniaxial press forming, cold isostatic pressing (CIP), or hot pressing. In the case of press forming, the pressure may be, for example, 98 MPa.

Next, the compact is fired. The firing is carried out in such a manner that the compact is fired in an oxidizing atmosphere or a vacuum atmosphere at a temperature of 1600° C. or higher and 2000° C. or lower, whereby a YAG sintered body that has yet to be heat treated can be obtained. The firing time is preferably 1 hour or more and 20 hours or less. The temperature increasing rate is preferably, for example, 30° C./hr or more and 100° C./hr or less. If necessary, a debindering step may be added before the firing step. In addition, a step of densifying the YAG sintered body by pressurization using hot isostatic pressing (HIP) may be performed. Through these steps, the YAG sintered body that has yet to be heat treated can be prepared.

In the step of processing the prepared YAG sintered body, a predetermined surface of the prepared YAG sintered body is processed to Ra of 0.5 µm or less. The reason why the arithmetic average roughness Ra is sufficiently reduced at this stage is that Ra does not change much in the step of heat treatment. Processed surfaces other than the predetermined surface may be, but need not be, processed to Ra of 0.5 µm or less.

In the step of heat treating the processed YAG sintered body, the processed YAG sintered body is heat treated at a temperature of 1400° C. or higher and 1700° C. or lower for 1 hour or more. The heat treatment atmosphere is preferably an oxidizing atmosphere or a vacuum atmosphere. This heat treatment step ensures that the YAG sintered body after firing, if post processed, will have a processed surface in an improved surface state with improved plasma resistance. In addition, there is no need to strictly control the shrinkage rate of a compact in firing, and a precise structure can be produced even in the case of having a complicated flow channel or the case of a small-sized structure with a narrow flow channel.

Through these steps, a YAG sintered body that ensures the plasma resistance of a predetermined surface among processed surfaces of the YAG sintered body and that is at a reduced risk of dust particle generation can be produced.

EXAMPLES AND COMPARATIVE EXAMPLES

Example 1

A yttrium oxide raw material powder (purity: 99.9%, average particle size: 1 μm) and an aluminum oxide powder (purity: 99.99%, average particle size: 0.5 μm) were weighed such that the weight ratio between the yttrium oxide raw material powder and the aluminum oxide powder was 57:43.

The weighed raw material powders were then put into a pot together with a PVA binder as a binder in an amount of 2.0 wt % relative to the total amount, a water-soluble acrylic dispersant as a dispersant in an amount of 0.3 wt % relative to the total amount, and an appropriate amount of ion-exchange water, and wet mixing was performed with a ball mill containing resin balls to form a raw slurry. The mixing time was 36 hours.

Next, the raw slurry was dried and granulated with a spray dryer, and the granular powder was put into a die and formed into a compact by cold isostatic pressing (CIP). Next, the formed compact was fired at a temperature of 1700° C. in an air atmosphere for 10 hours. The temperature increasing rate was 60° C./hr. A plurality of test pieces 50 mm square and 2 mm thick were cut out from the YAG sintered body after firing.

Next, the cut test pieces were subjected to surface grinding and polishing. The surface grinding and polishing were carried out such that the surface roughness Ra of a predetermined surface would be 0.5 μm or less. The processed test pieces of the YAG sintered body were then heat treated at a temperature of 1400° C. for 1 hour in an oxidizing atmosphere. In this manner, YAG sintered body test pieces of Example 1 were prepared.

Example 2

YAG sintered body test pieces of Example 2 were prepared under the same conditions as in Example 1 except that the heat treatment temperature was 1500° C.

Example 3

YAG sintered body test pieces of Example 3 were prepared under the same conditions as in Example 1 except that the heat treatment temperature was 1600° C.

Example 4

YAG sintered body test pieces of Example 4 were prepared under the same conditions as in Example 1 except that the heat treatment temperature was 1700° C.

Comparative Example 1

YAG sintered body test pieces of Comparative Example 1 were prepared under the same conditions as in Example 1 except that heat treatment was not performed after surface grinding and polishing.

Comparative Example 2

YAG sintered body test pieces of Comparative Example 2 were prepared such that surface processing, etc. were performed after a compact was formed and surface grinding, polishing, and heat treatment were not performed after firing at 1700° C. The conditions of weighing, mixing, and firing were the same as in Example 1.

Comparative Example 3

YAG sintered body test pieces of Comparative Example 3 were prepared under the same conditions as in Example 1 except that the heat treatment temperature was 1300° C.

Comparative Example 4

YAG sintered body test pieces of Comparative Example 4 were prepared under the same conditions as in Example 1 except that the heat treatment temperature was 1800° C.

Example 3-2

A YAG sintered body was produced using the same raw materials and under the same conditions as in Example 1 except that the temperature increasing rate in the sintering of the YAG sintered body was 100° C./hr. Test pieces were cut out from the sintered body, and YAG sintered body test pieces of Example 3-2 were prepared under the same conditions as in Example 3.

Example 3-3

A YAG sintered body was produced using the same raw materials and under the same conditions as in Example 1 except that the time of mixing the raw material powders of the YAG sintered body was 15 hours. Test pieces were cut out from the sintered body, and YAG sintered body test pieces of Example 3-3 were prepared under the same conditions as in Example 3.

Evaluation Method

Surface State (Roughness)

For each of the test pieces of Examples and Comparative Examples, arithmetic average roughness (Ra), maximum height (Rz), and maximum valley depth (Rv) were measured before and after the heat treatment. The measurement of arithmetic average roughness (Ra), maximum height (Rz), and maximum valley depth (Rv) was carried out using a stylus-type surface roughness meter (in accordance with JIS B 0601).

Number of Intragranular Pores

For each of the test pieces of Examples and Comparative Examples, the number of intragranular pores on the predetermined surface was calculated after the heat treatment. The calculation of the number of intragranular pores was carried out using a scanning electron microscope (SEM) by capturing an image of the predetermined surface of each test piece at a magnification of 2000× and counting the number of intragranular pores in fields of view of 80 μm×60 μm. The number of intragranular pores was defined as a value obtained by capturing images of randomly selected three different areas of each test piece and rounding up an average value of the counted numbers of intragranular pores to the nearest whole number.

Area Percentage of Aluminum Oxide

For each of the test pieces of Examples and Comparative Examples, the area percentage of aluminum oxide ($Al_2O_3$) on the predetermined surface was calculated after the heat treatment. The calculation of the area percentage of aluminum oxide was carried out using a scanning electron microscope (SEM) by capturing an image of the predetermined surface of each test piece at a magnification of 2000× and determining the area percentage of simple aluminum oxide present at grain boundaries. In the determination, areas with a predetermined color tone in the SEM image were preliminarily confirmed to be aluminum oxide by EDS analysis, and image processing such as binarization was performed using image analysis software WinROOF. The area percentage of aluminum oxide was defined as a maximum value of area percentages determined from captured images of randomly selected three different areas of each test piece.

Evaluation Results

Figure 3A:
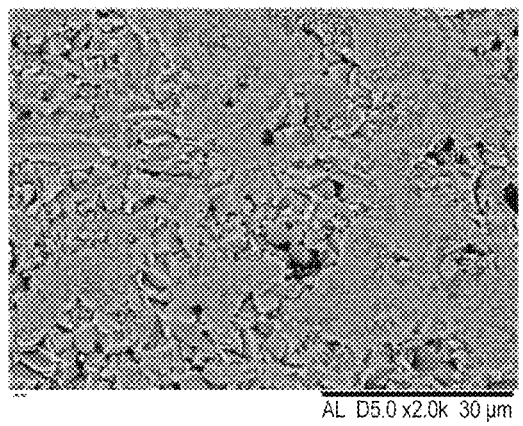
FIGS. 3A to 3F are SEM images of predetermined surfaces of YAG sintered bodies of Comparative Example 1, Examples 1 to Example 4, and Comparative Example 2, respectively.
Figure 3B:
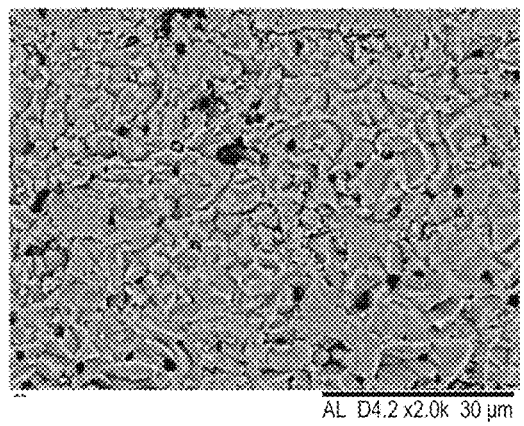
Figure 3C:
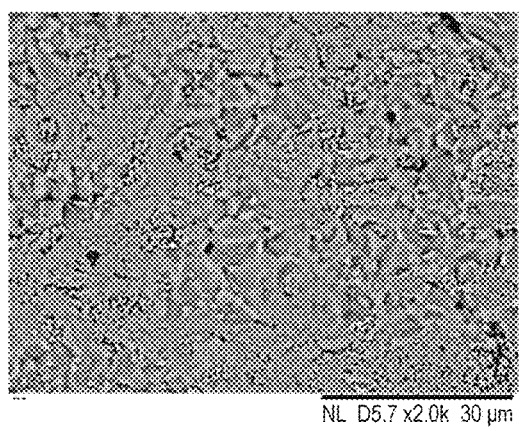
Figure 3D:
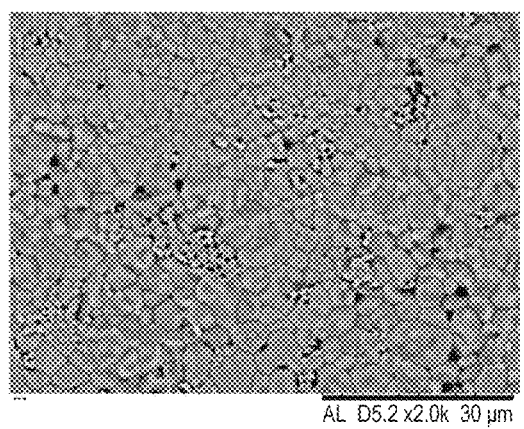
Figure 3E:
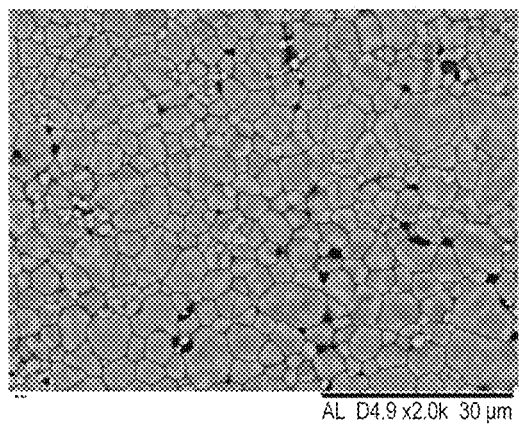
Figure 3F:
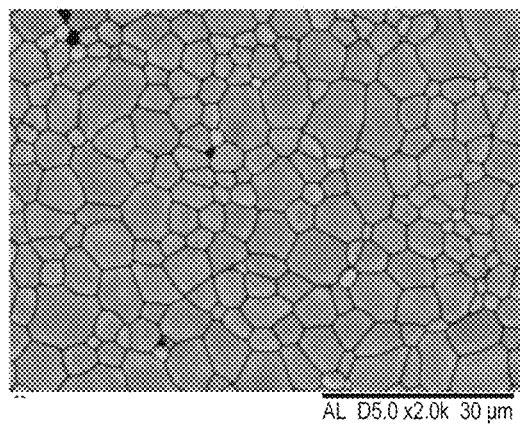

FIGS. 3A to 3F are SEM images of predetermined surfaces of the YAG sintered bodies of Comparative Example 1, Examples 1 to Example 4, and Comparative Example 2, respectively. In FIG. 3A, heat treatment is not performed after surface processing. From FIGS. 3B to 3E, the heat treatment temperature after surface processing is gradually increased. FIG. 3F shows the state of an as-sintered surface not subjected to surface processing. As can be seen from these figures, as the heat treatment temperature is increased starting from the processed surface not subjected to heat treatment after surface processing, the surface state of the processed surface becomes closer to the as-sintered surface. This is numerically expressed by Ra and Rv/Rz values.

FIG. 4 to FIG. 6 are tables showing the test results of Examples and Comparative Examples. The table in FIG. 4 shows that the YAG sintered body of the present invention shows no great change in arithmetic average roughness Ra as a result of the heat treatment step after surface processing but shows a decrease in Rv/Rz as a result of the heat treatment step. The YAG sintered bodies of Example 1 to Example 4, as compared to Comparative Example 1 in which heat treatment is not performed after surface processing, have improved surface states, that is, Rv/Rz values of 0.7 or less, showing that the plasma resistance has improved. Particularly in Example 3 and Example 4, the Rv/Rz values are comparable to that in Comparative Example 2, showing that plasma resistance comparable to that in Comparative Example 2 is ensured. By contrast, in Comparative Example 1, processing marks remain as they are, and hence the Rv/Rz value exceeds 0.7. In Comparative Example 1, the Rv/Rz value exceeds 0.7, and thus particles starting from the processing marks may occur, and the plasma resistance is low.

Examples 1 to 4 and Comparative Examples 3 and 4 have shown that the heat treatment temperature is preferably 1400° C. or higher and 1700° C. or lower. It has been shown that a heat treatment temperature of lower than 1400° C. can fail to sufficiently decrease the Rv/Rz value and fail to achieve sufficiently high plasma resistance. This is probably because when the heat treatment temperature is low, fine grain growth is not promoted. It has also been shown that a heat treatment temperature of higher than 1700° C. can fail to sufficiently decrease the Rv/Rz value and fail to achieve sufficiently high plasma resistance. This is probably because when the heat treatment temperature is high, grain growth is excessively promoted, and as a result, the surface state is changed by coarse grains, resulting in an increase in Ra.

In Example 3-2 in which the heat treatment temperature was the same as that in Example 3 and the temperature increasing rate among the heat treatment conditions was changed, the number of intragranular pores increased. The increased intragranular pores are more susceptible to plasma erosion than other parts and can cause dust particle generation, and thus the number of intragranular pores exposed on the surface is preferably as small as possible. In Comparative Example 1, in which the heat treatment step was not performed, and Comparative Example 3, in which the heat treatment temperature was low, the number of intragranular pores was difficult to measure because of their surface state and thus was judged as unmeasurable.

In Example 3-3 in which the heat treatment temperature was the same as that in Example 3 and the time of mixing the raw material powders was changed, the area percentage of aluminum oxide increased. It has been shown that since parts existing as simple aluminum oxide have lower plasma resistance than parts existing as YAG, and hence are susceptible to plasma erosion and can cause dust particle generation, the area percentage of segregation existing as simple aluminum oxide is preferably as small as possible.

The above results have confirmed that the YAG sintered body of the present invention is a YAG sintered body having a surface that, even if processed, has high plasma resistance and usable as a semiconductor manufacturing equipment member.

It should be noted that the present invention is not limited to the embodiment described above and can be appropriately modified without departing from the scope of the invention.

What is claimed is:

1. A YAG sintered body comprising a predetermined surface where intragranular pores are exposed,
   wherein, on the predetermined surface, arithmetic average roughness Ra satisfies Ra≤0.5 μm, and a ratio between maximum height Rz and maximum valley depth Rv satisfies Rv/Rz≤0.7.

2. The YAG sintered body according to claim 1, wherein, on the predetermined surface, a number of the intragranular pores observed in an area of 80 μm×60 μm is 40 or less.

3. The YAG sintered body according to claim 1, wherein, on the predetermined surface, an area percentage of aluminum oxide observed in an area of 80 μm×60 μm is 2.0% or less.

4. The YAG sintered body according to claim 2, wherein, on the predetermined surface, an area percentage of aluminum oxide observed in the area of 80 μm×60 μm is 2.0% or less.

5. A semiconductor manufacturing equipment member comprising the YAG sintered body according to claim 1.

6. A semiconductor manufacturing equipment member comprising the YAG sintered body according to claim 2.

7. A semiconductor manufacturing equipment member comprising the YAG sintered body according to claim 3.

8. A semiconductor manufacturing equipment member comprising the YAG sintered body according to claim 4.

9. A gas nozzle for use in semiconductor manufacturing equipment,
   the gas nozzle comprising the semiconductor manufacturing equipment member according to claim 5.

10. A gas nozzle for use in semiconductor manufacturing equipment,
    the gas nozzle comprising the semiconductor manufacturing equipment member according to claim 6.

11. A gas nozzle for use in semiconductor manufacturing equipment,
 the gas nozzle comprising the semiconductor manufacturing equipment member according to claim 7.

12. A gas nozzle for use in semiconductor manufacturing equipment,
 the gas nozzle comprising the semiconductor manufacturing equipment member according to claim 8.

* * * * *